United States Patent
Lee et al.

(10) Patent No.: US 6,692,680 B2
(45) Date of Patent: Feb. 17, 2004

(54) REPRODUCTION OF MICROMOLD INSERTS

(75) Inventors: Jeong-Bong Lee, Dallas, TX (US); Harish Manohara, Baton Rouge, CA (US); Kabseog Kim, Baton Rouge, TX (US); Sang-Won Park, Baton Rouge, TX (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 260 days.

(21) Appl. No.: 09/970,246

(22) Filed: Oct. 3, 2001

(65) Prior Publication Data

US 2003/0062652 A1 Apr. 3, 2003

(51) Int. Cl.$^7$ ............................................. B29C 33/38
(52) U.S. Cl. ........................ 264/485; 205/70; 216/67; 216/83; 264/220; 264/221; 264/227
(58) Field of Search ................. 264/220, 221, 264/227, 485; 205/70; 216/67, 83

(56) References Cited

U.S. PATENT DOCUMENTS

| | | | | |
|---|---|---|---|---|
| 4,381,963 A | * | 5/1983 | Goldstein et al. | 156/245 |
| 5,435,959 A | | 7/1995 | Williamson et al. | 264/221 |
| 5,580,507 A | | 12/1996 | Williamson et al. | 264/221 |
| 5,658,515 A | * | 8/1997 | Lee et al. | 264/219 |
| 5,762,845 A | * | 6/1998 | Crumly | 264/104 |
| 5,900,160 A | | 5/1999 | Whitesides et al. | 216/41 |
| 5,944,974 A | * | 8/1999 | Fahrenberg et al. | 205/70 |
| 5,976,457 A | | 11/1999 | Amaya et al. | 419/36 |
| 6,033,202 A | | 3/2000 | Bao et al. | 425/120 |
| 6,039,897 A | | 3/2000 | Lochhead et al. | 264/1.24 |
| 6,136,243 A | * | 10/2000 | Mehregany et al. | 264/162 |
| 6,258,311 B1 | * | 7/2001 | Jens et al. | 264/220 |
| 6,472,459 B2 | * | 10/2002 | Morales et al. | 524/439 |

OTHER PUBLICATIONS

Becker, H. et al., "Polymer High Aspect Ratio Structures Fabricated With Hot Embossing," *Digest of Technical Papers, The 10th International Conference on Solid–State Sensors and Actuators*, pp. 1432–1435 (1999).

Chung, C. et al., "High aspect silicon trench fabrication by inductively coupled plasma," *Microsystem Technologies*, vol. 6 (3), pp. 106–108 (2000).

Duffy, D.C. et al., "Rapid Prototyping of Microfluidic Switches in Polydimethylsiloxane and Their Actuation by Electro–Osmostic Flow," *J. Micromechanics and Microengineering*, vol. 9, pp. 211–217 (1999).

Jo, B.H. et al., "Three–dimensional Micro–channel Fabrication in Polydimethylsiloxane (PDMS) Elastomer," *IEEE/ASME J. Microelectromechanical Systems*, vol. 9, No. 1, pp. 76–81 (2000).

(List continued on next page.)

*Primary Examiner*—Allan R. Kuhns
(74) *Attorney, Agent, or Firm*—André J. Porter; John H. Runnels; Bonnie J. Davis (57) ABSTRACT

Methods of rapidly prototyping microstructures such as HARMs are disclosed. A high precision process uses polymeric microstructure replication techniques and sacrificial layer etching techniques to mass produce high aspect ratio metallic and polymer micromold inserts. In one embodiment, after fabrication of an initial micromold insert, high aspect ratio replications are created by casting replication material, such as PDMS, directly onto the initial micromold insert. The replicated HARM is coated with a sacrificial layer and then electroplated to replicate another set of micromold inserts. After the electroplating process is completed, the sacrificial layer is etched away to release the replicated micromold inserts.

10 Claims, 5 Drawing Sheets

OTHER PUBLICATIONS

Lorenz, H. et al., "High aspect ratio, ultrathick, negative–tone near–UV photoresist and its applications for MEMS," *Sensors and Actuators A–Physical*, vol. 64 (1), pp. 33–39 (1998).

Lötters, J.C. et al., "The mechanical properties of the rubber elastsic polymer polydimethylsiloxane for sensor applications," Presentation to MESA Research Institute, The Netherlands, vol 7(3) pp. 145–147 (1996).

K. Kim, et al., "Polydimethylsiloxane ("PDMS") for High Aspect Ratio Three–dimensional MEMS," in *Proceedings of the 2000 International Symposium on Mechatronics and Intelligent Mechanical Systems for the 21 Century*, pp. 55–59, held in Changwon, Korea on Oct. 4–7, 2000.

* cited by examiner

REPRODUCTION OF MICROMOLD INSERTS

This invention pertains to microstructures, particularly a method of rapid prototyping to create polymeric and metallic high aspect ratio microstructures ("HARMs").

In the last few years, research on low-cost, mass production microfabrication techniques for microelectromechanical systems ("MEMS") devices has been very active. The MEMS research community has adopted and modified conventional polymer forming techniques (e.g., hot embossing and injection molding) to massively replicate micronscale plastic MEMS devices. Many polymers have been investigated as candidate massive replication materials for MEMS, including polycarbonate, polymethyl methacrylate ("PMMA"), polyvinyl chloride, polyethylene, and polydimethylsiloxane ("PDMS"), but none are well suited for massive manufacturing of MEMS using conventional massive replication techniques. See H. Becker et al., "Polymer High Aspect Ratio Structures Fabricated With Hot Embossing," *Digest of Technical Papers, The* 10*th International Conference on Solid-State Sensors and Actuators*, pp. 1432–1435 (1999) and D. C. Duffy et al., "Rapid Prototyping of Microfluidic Switches in Polydimethylsiloxane and Their Actuation by Electro-Osmostic Flow," *J. Micromechanics and Microengineering*, vol. 9, pp. 211–217 (1999).

With the exception of PDMS, casting of most thermoplastic materials generally requires either a modified injection molding machine or a hot embosing machine. PDMS precursors are generally a mixture of dimethylsiloxane and a curing agent, and are available, for example, under the trademark SYLGARD 184® (Dow Corning, Midland, Mich.). PDMS largely eliminates the need for injection molding and hot embossing machines to replicate microstructures because it can be casted and fully cured at 65° C. Currently, PDMS is mainly used by the MEMS community for microstructure replications in micro total analysis system applications ("μTAS"). See B. H. Jo et al., "Threedimensional Micro-channel Fabrication in Polydimethylsiloxane (PDMS) Elastomer," *IEEE/ASME J. Microelectromechanical Systems*, vol. 9, no. 1, pp. 76–81 (2000).

HARMs are preferably used in micron-scale MEMS applications. HARMs provides a number of advantages to MEMS, such as structural rigidity, lower driving voltage in actuator systems, higher sensitivity in sensor applications, and larger magnetic forces in magnetic MEMS. In μTAS, HARMs provide a higher active surface area per unit substrate surface area, a higher packing density of microstructural elements, and a higher throughput in continuous flow systems due to larger cross-sections per unit substrate area.

Commercial manufactures have traditionally used metallic and ceramic micromolds to replicate polymeric microstructures. Metallic micromolds are generally fabricated using a LIGA process, while ceramic micromolds are usually fabricated using a ceramic casting process. ("LIGA" is a German acronym for "lithography, electrodeposition, and plastic molding.") The LIGA process is a well-known technique that makes it possible to create HARMs having an aspect ratio of approximately 100:1. While LIGA, in many instances, is a preferred method of fabricating HARMs, it requires access to a synchrotron radiation source, which is generally undesirable in mass reproduction due to costs associated with building and maintaining a synchrotron radiation facility.

H. Lorenz et al., "High aspect ratio, ultrathick, negativetone near-UV photoresist and its applications for MEMS," *Sensors and Actuators A-Physical*, vol. 64 (1), pp. 33–39 (1998) discloses an alternative method for fabricating micromolds using a LIGA-like process that produces lower resolutions and aspect ratios than can be made with a LIGA process.

C. Chung et al., "High aspect silicon trench fabrication by inductively coupled plasma," *Microsystem Technologies*, vol. 6 (3), pp. 106–108 (2000) discloses another alternative process to fabricating micromolds. This process requires the creation of a deep silicon trench using deep reactive ion etching, based on inductively coupled plasma.

Micromolds are used to manufacture inverse images of plastic microstructures using injection molding or hot embossing techniques. However, metallic and ceramic micromold inserts tend to wear out after repeated use. When a mold wears out, a new mold must be made using an x-ray synchrotron source. Thus, in order to replicate plastic microstructures of the same quality (similar tolerances) micromolds should be replaced regularly. For example, nickel micromolds are usually replaced after approximately 100 injection molding sequences have been performed.

U.S. Pat. No. 6,039,897 describes a method for patterning materials onto a substrate surface using an elastomeric mold formed by placing an elastomeric master in conforming contact with the substrate surface. A micro-molding fluid that is a precursor of the material to be patterned is introduced into elastomeric mold reservoirs and then solidified.

U.S. Pat. No. 6,033,202 describes an elastomeric mold for fabricating microstructures comprising a body of elastomeric material having first and second surfaces. The first surface includes at least one recessed microchannel while the second surface includes at least one mold filling member that extends through the mold to the first surface and communicates with the recessed microchannel.

U.S. Pat. No. 5,976,457 describes a method for rapid fabrication of molds or mold components to be used in die cast and injection tools by using a powder injection molding process and a sintering process to form a full or nearly full density metal die or mold component.

U.S. Pat. No. 5,900,160 describes methods of forming a patterned self-assembled monolayer on surfaces and derivative articles. Self-assembled monolyers are typically formed of molecules each having a functional group that selectively attaches to a particular surface.

U.S. Pat. Nos. 5,580,507 and 5,435,959 describe methods for making a mold using a model. A mold carrier is formed having an aperture with a corresponding shape therein. After positioning the model within the aperture, a resilient first material is poured into the space covering the outer peripheral surface of the model, forming a resilient mold insert. The model is removed from the resilient mold insert and a second material is poured into the aperture of the mold carrier with the resilient mold insert disposed along the inner peripheral surface of the aperture, forming a duplicate replicate of the outer peripheral surface of the model. The duplicate is then removed from the resilient mold insert. A mold is formed from the duplicate and is used to make replicas of the model.

An unfilled need exists for a fast and inexpensive microfabrication technique for mass production of micron-scale HARMs MEMS devices.

We have discovered methods for rapid replication of HARMs and MEMS devices by massively reproducing micromold inserts. These methods are highly precise processes that use polymeric microstructure replication techniques and sacrificial layer etching techniques to fabricate high aspect ratio metallic and polymeric micromold inserts.

The novel methods are less expensive than prior processes such as LIGA for fabricating multiple metallic molds. The novel methods use one (or more) initial electroplated micromold inserts to massively reproduce high quality, high aspect ratio inserts.

In one embodiment, following fabrication of an initial micromold insert, high quality, high aspect ratio replications are created by repeatedly casting a replication material directly onto the initial micromold insert to create HARM replications. The HARM replications are coated with a sacrificial layer, and are then electroplated to replicate another set of micromold inserts. (The sacrificial layer is used to separate the reproduced mold insert from the reverse-image PDMS mold.) After the electroplating process is completed, the sacrificial layer is etched away to release the replicated micromold inserts.

The general purpose of this invention is to provide inexpensive methods for rapid, massive production of metallic and polymeric HARMs for general MEMS applications. More specifically, the purpose of this invention is to provide inexpensive methods for rapid reproduction of metallic micromold inserts suitable for the production of polymeric microstructures. To facilitate the replication of high precision polymeric and metallic HARMs, it is essential that the mass replication material be capable of creating an inverse image of the initial micromold insert with a high level of precision (preferably at the nanometer scale) and faithful reproduction, when using techniques such as direct casting and spin casting. (High precision is preferred because a replicated microstructure, ideally, should be the reverse image of the initial micromold insert.) A preferred replication material is PDMS, more preferably, a 10:1 PDMS mixture of RTV 615A (pre-polymer) and 615B (curing agent) (GE Silicon, Waterford, N.Y.), which was used to practice this invention. PDMS is preferred because it is a durable, optically transparent, and inexpensive microelectronics-compatible silicone elastomer. PDMS has a low glass transition temperature ($T_g$=−125° C.), a high shear modulus (shear modulus is between about 100 kPa and 3MPa) and is compressible without mechanical failure. It also has a low loss tangent (tan δ<<0.001) and a high dielectric strength (~14 V/μm). See J. C. Lotters et al., "The Mechanical Properties of the Rubber Elastic Polymer Polydimethylsiloxane for Sensor Applications," *J. Micromechanics and Microengineering*, vol 7(3), pp. 145–147, 1997.

EXAMPLE 1

Figure 1:
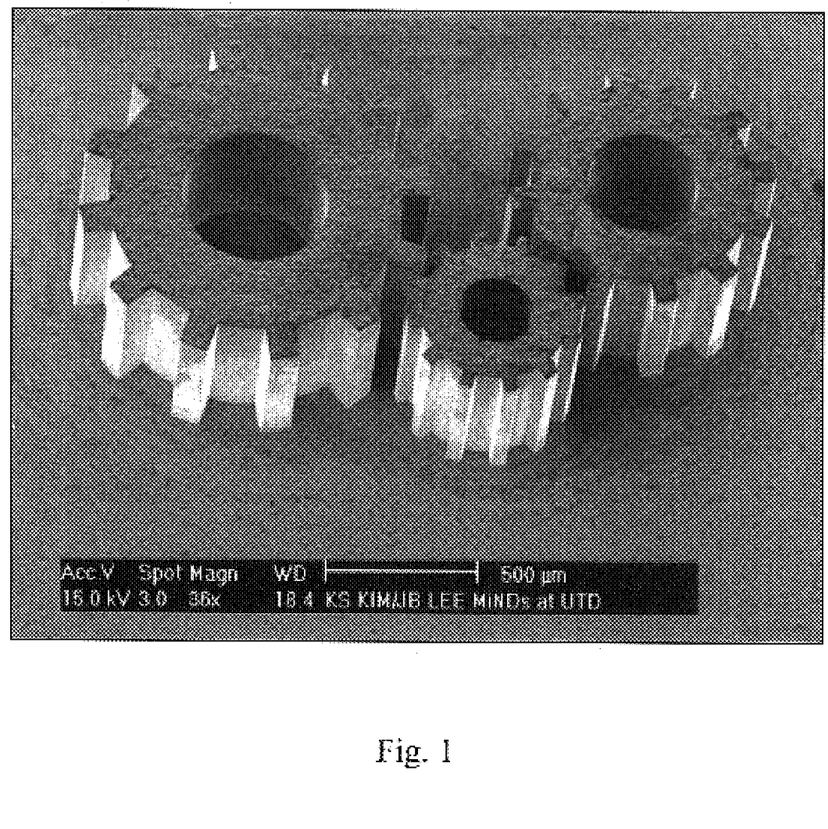
FIG. 1 is a scanning electron microscopy photomicrograph of an electroplated nickel mold insert.

FIG. 1 shows an electroplated micromold gear insert prepared using conventional LIGA techniques. (Other techniques can be used to prepare micromold inserts for use in accordance with this invention, such as LIGA-like and silicon micromachined structures.) The micromold gear insert was approximately 300 μm thick with a maximum aspect ratio of 15:1. A variety of substrates (e.g., nickel, stainless steel, titanium, silicon, etc.) can be used to prepare micromold inserts. When using non-conducting substrates (e.g., silicon wafers, titanium/copper (1000 Å)/(3000 Å)) as adhesion and plating layers, the substrates are typically sputter coated before applying LIGA.

A polished nickel substrate, was first cleaned with a mixture of soap, acetone, isopropyl alcohol and deionized water, and then dried in an oven at 110° C. The nickel substrate was then activated using C-12 activator (Puma Chemical, Warne, N.C.) to obtain better adhesion of PMMA sheet to the nickel substrate and then bonded to a PMMA sheet (Goodfellow, Huntingdon, UK). (Activation is an electrochemical process to clean the surface of metallic substrate to be ready for electroplating.) Activation was performed potentiostatically at an applied voltage of 2 V for 1 minute, and then the nickel substrate was cleaned with deionized water and dried. The nickel substrate was then spun with a 9% PMMA solution. (The substrate was spun at a speed of 2500 rpm for approximately 30 seconds to achieve a PMMA thickness of 1~2 μm, and then baked in an oven at 150° C. for 1 hour with a nitrogen flow.) Once the PMMA reached the desired thickness, the PMMA was cleaned with isopropyl alcohol and deionized water, and then annealed in an oven under a nitrogen atmosphere at 80° C., for at least 2 hours. The PMMA was solvent bonded to the substrate, using a mixture of powdered PMMA, methylmethacrylate monomer, benzoly peroxide, dimethyl aniline, and methacryloxypropyltrinethoxysilane, with a mixture ratio of 15:85:1.5:1:1 by weight, and then cut to a desired thickness, typically between 300~500 μm. The PMMA sheet was then exposed to a synchrotron radiation source using a relatively low cost, graphite-based x-ray mask. The x-ray mask comprised a 150 μm thick graphite membrane and a 15 μm thick gold plated absorber layer. See U.S. patent application Ser. No. 09/603,512, filed Jun. 26, 2000.

A gear-patterned PMMA mold was created by developing the exposed PMMA sheet in a GG developer. A GG developer is an empirically defined molecular weight-sensitive solvent comprising about 60% diethylene glycol butyl ether, about 20% morpholine, about 5% ethanolamine, and about 15% water. The 300 μm thick PMMA sheet required 3 cycles of 20 minutes developing and 40 minutes rinsing, while the 500 μm thick PMMA sheet required 5 cycles. The PMMA mold was then electroplated using a nickel sulfamate solution at 55° C. with a current density of 10 mA/cm$^2$ or smaller. (The nickel sulfamate solution comprised of nickel sulfamate, 450 ml/l of $Ni(SO_3NH_2)_2$, boric acid, 37.5 g/l of $H_3BO_3$, sodium lauryl sulfate, 3 g/l of $C_{12}H_{25}NaO_4S$ and deionized water, mixed with sulfuric acid ($H_2SO_4$) or sodium hydroxide (NaOH) to produce a pH of approximately 4.) Before electroplating the PMMA mold, the plating solution was filtered and the samples were soaked. The samples were then evacuated in a diluted electroplating solution. During electroplating, the electroplating solution was mechanically stirred and the pH level of the solution periodically measured. After electroplating the PMMA mold, acetone was used to strip away the PMMA mold, leaving a high aspect ratio, metallic micromold gear insert, as shown in FIG. 1.

The following replications were produced using nickel as a substrate for the micromold gear inserts. Micromold inserts should be designed to compensate for the thickness of the sacrificial layer that will overcoat the inserts. For example, if an original mold insert having a 5 μm thick surface is overcoated with a 1 μm thick sacrificial layer, then the final reproduced micomold insert will be 1 μm smaller than the original, in all dimensions. Thus, in order to produce a final reproduced micromold insert having a 5 μm thickness, the original micromold insert should be 4 μm thick to compensate for the 1 μm sacrificial layer.

EXAMPLE 2

In one embodiment, a micromold insert was replicated by spin-coating PDMS onto the micromold insert. The cured PDMS thickness was about 5 mm. The PDMS micromold insert was then placed in a desiccator and degassed using a vacuum pump. Afterwards, the micromold insert was cured at 65° C. for approximately one hour to create a replicated PDMS mold. Once the replicated mold was created, it was peeled off from the metallic micromold insert and examined for defects. No major surface defects were observed on the peeled off PDMS. Additionally, no mechanical wear was seen on the surface of the micromold insert. (All fabrication processing steps were carried out in an unclean environment.)

EXAMPLE 3

In another embodiment, micromold inserts were massively replicated using PDMS HARMs. Numerous PDMS HARMs were replicated and deposited onto circuit-containing substrates. (PDMS's relatively low processing temperature, and the ease of using it to prepare polymeric HARMs make it an attractive processing aid material for the direct integration of metallic HARMs onto circuit-containing substrates.) An initial metallic micromold insert was prepared using conventional LIGA. The insert PDMS was placed in a plastic desiccator and then degassed to remove entrapped bubbles during mixing. PDMS was either cast or spin-coated onto the metallic micromold insert with a glass ring on it, where the glass ring has been sealed with AZP 4620 photoresist (Clariant Corporation, Sommerville, N.J.). A flat glass weighing approximately 1 lb was placed on top of the cast or spin-coated PDMS to eliminate any excess PDMS formations on top of the metallic micromold insert. The insert was then placed in a plastic desiccator and degassed. The insert was cured at 100° C. for 1 hour. The replicate PDMS mold was then peeled from the metallic micromold insert. (These steps can be repeated to obtain multiple numbers of PDMS molds.) Although a flat glass was placed on top of the cast/spin-coated PDMS to eliminate the excess PDMS formations on top of the metallic micromold insert, a thin layer of excess PDMS formed on top of the metallic micormold insert. (The thin layer of PDMS had to be opened for a successful pattern transfer.) The thin layer of excess PDMS was etched using a flood plasma etching with 10% $CF_4/O_2$ plasma at an incident power of 300 W at 60 m Torr.

After the thin layer of excess PDMS was etched away the replicate PDMS mold was attached to a silicon based, circuit-containing substrate having a titanium or a copper seed layer, and a pre-deposited AZP 4620 photoresist. In this embodiment, the pre-deposited AZP 4620 photoresist had a thickness of approximately 6 μm. (The photoresist had been removed prior to electroplating the PDMS mold using plasma etching to expose the seed layer for electroplating.) The PDMS mold was electroplated with nickel for approximately 30 minutes under 3% $CF_4/O_2$ at 600 mTorr with an incident power of 300 Watts. The electroplating process was performed at approximately 55° C. with a current density of 10 $mA/cm^2$, creating a metallic HARM on the circuit-containing substrate through the PDMS mold. The metallic HARM was released by immersing the sample in Dynasolve 210 (Dynaloy, Inc., Indianapolis, Ind.) for about 2 hours.

EXAMPLE 4

Figure 2A:
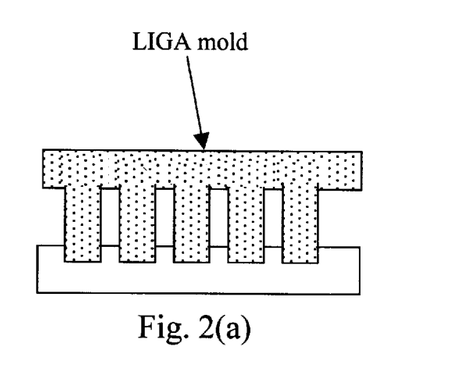
FIGS. 2a–2e show a schematic diagram of a fabrication sequence for the reproduction of metallic micromold inserts.
Figure 2B:
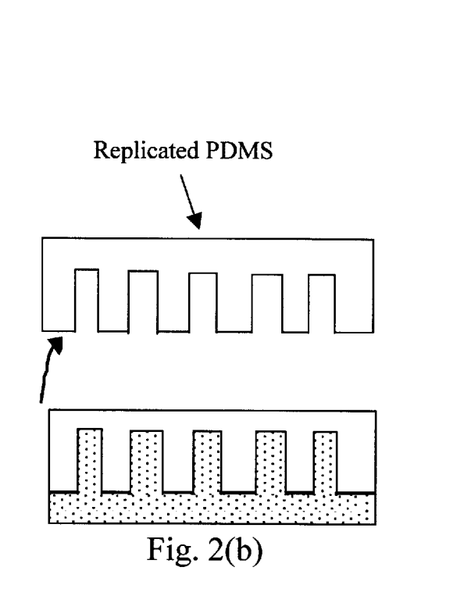
Figure 2C:
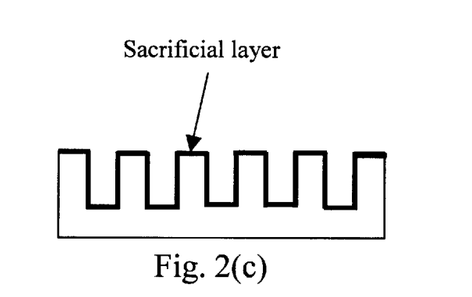
Figure 2D:
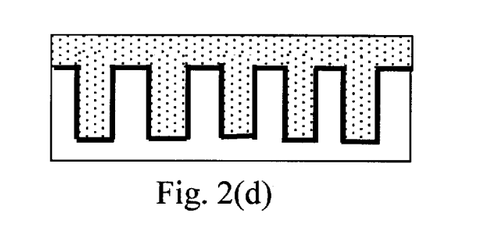
Figure 2E:
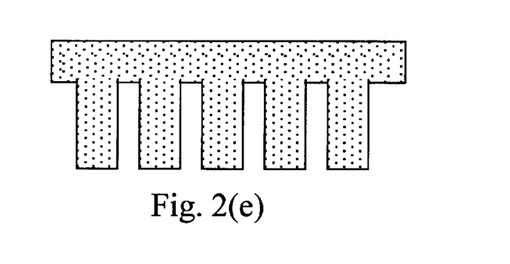

FIGS. 2a–2d show a schematic diagram of a fabrication sequence for the reproduction of metallic micromold inserts using PDMS and sacrificial layer etching. First, PDMS is cast onto a nickel micromold insert and placed in a desiccator to remove trapped bubbles, as shown in FIG. 2a. Next, the PDMS is cured at a temperature of approximately 100° C. for at least one hour to create replicated PDMS HARMs. As shown in FIG. 2b, after the curing process is complete the replicated PDMS HARMS is then peeled from the metallic micromold insert. Next, as shown in FIG. 2c, the replicate PDMS HARMs is coated with chromium (~50 Å)/gold (~300 Å) by electron beam evaporation to form a sacrificial layer. As shown in FIG. 2d, the replicated PDMS HARM micromold mold insert is then electroplated with nickel to reproduce another nickel micromold insert. Finally, the sacrificial layer is etched away by immersing the sample in acetone which releases the reproduced micromold insert, as shown in FIG. 2e.

EXAMPLE 5

Figure 3:
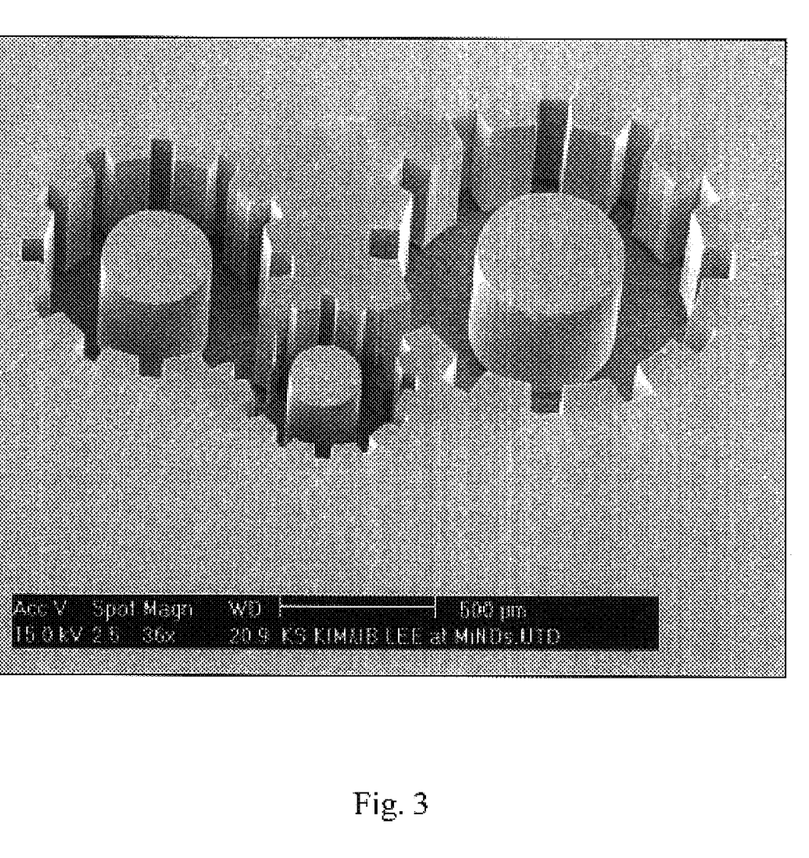
FIG. 3 is a scanning electron microscopy photomicrograph of a replicated polymer HARM.
Figure 4:
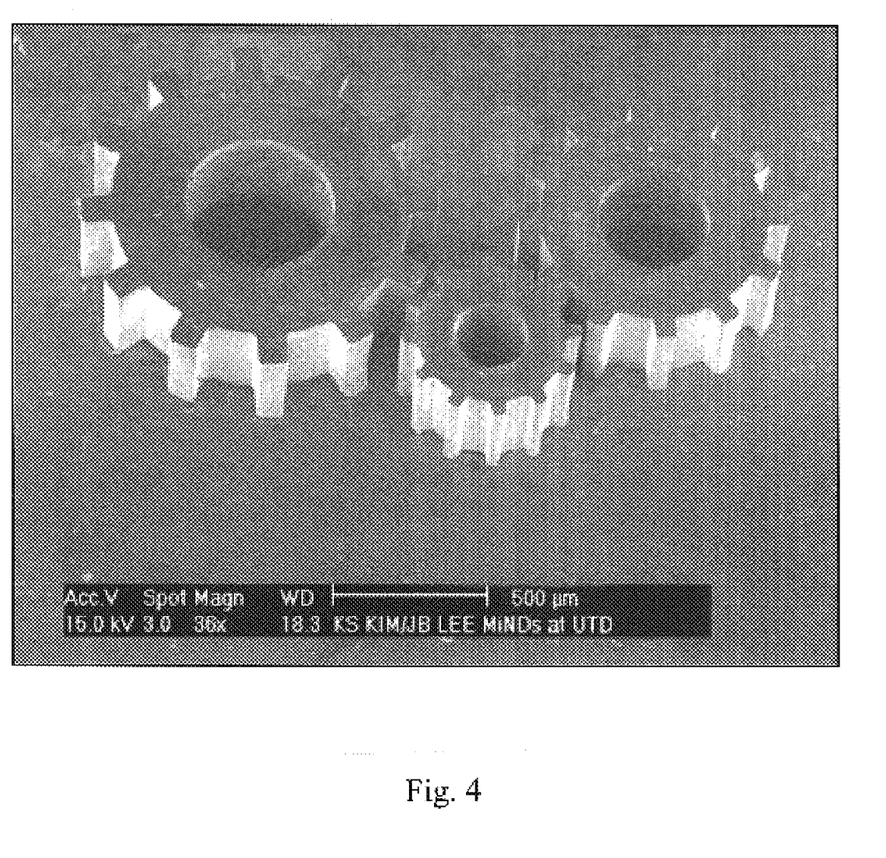
FIG. 4 is a scanning electron microscopy photo micrograph of a reproduced metallic micromold insert from a reverse image PDMS.

FIG. 3 is a replicated PDMS HARMS gear insert produced using the sacrificial layer etching technique explained in Example 4. PDMS was cast onto the metallic micromold gear insert shown in FIG. 1. After removing trapped bubbles and curing the PDMS, the replicated PDMS HARMS gear insert was coated with chromium (~50 Å)/gold (~300 Å) by electron beam evaporation. The replicated PDMS HARM gear insert was then electroplated with nickel to reproduce another micromold gear insert. Finally, the reproduced micromold gear insert was released by immersing the sample in acetone, as shown in FIG. 4.

Figure 5:
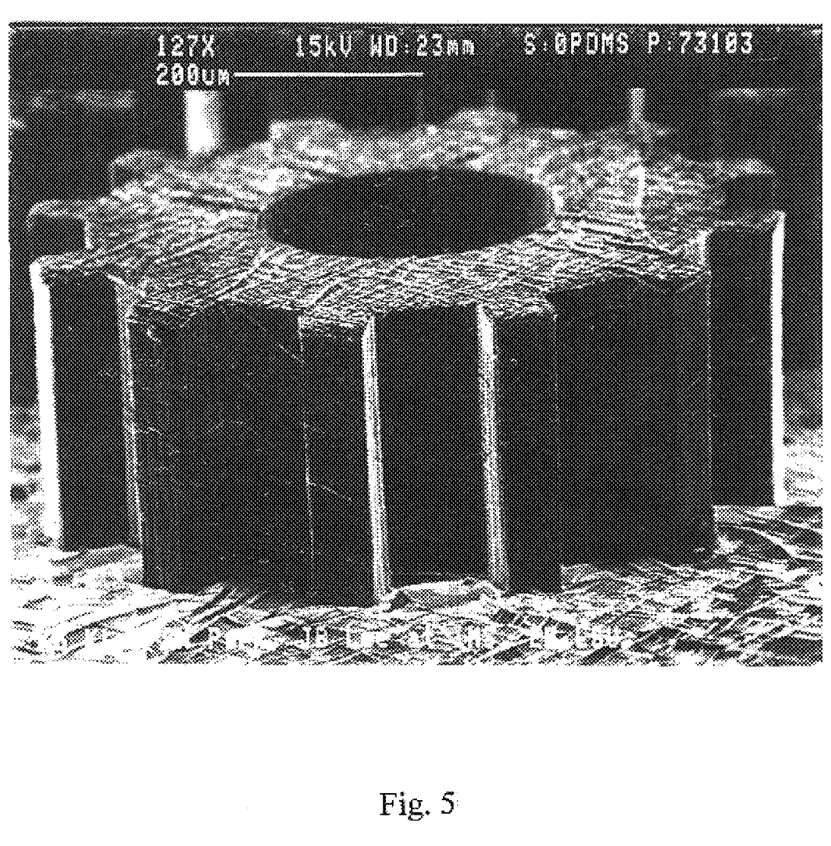
FIG. 5 is a scanning electron microscopy photomicrograph of a replicated metallic micromold insert using a sputter deposition technique.

FIG. 5 shows a scanning electron micrograph of a reproduced metallic micromold gear insert made from a reverse image PDMS mold. A sacrificial layer was deposited onto the PDMS mold using a sputtering deposition technique. Microcracks were observed on the reproduced metallic micromold insert. These cracks are believed to have been caused by temperature increases on the surface of the PDMS during sputtering deposition of the sacrificial layer.

Results

Surface roughness of both the electroplated nickel micromold inserts and the replicated PDMS HARM inserts, electroplated through sputtering, were measured using a WYKO® interferometric surface profiler (Veeco Instruments, Inc., Woodbury, N.Y.). A multitude of measurements were taken of the nickel micromold insert surface areas and matching surface areas of replicated PDMS HARMs. The average surface roughness on the nickel micromold insert was 204 nm, while the average surface roughness on the replicated PDMS HARM was 215 nm. Thus, no significant deviations in surface roughness were detected. While the sacrificial layer can be deposited using a sputtering deposition technique, a preferred method of depositing a sacrificial layer is electron beam evaporation.

The complete disclosures of all references cited in this specification are hereby incorporated by reference. Also incorporated by reference is the following publication of the inventors' own work: K. Kim, et al., "Polydimethylsiloxane ("PDMS") for High Aspect Ratio Three-dimensional MEMS," in *Proceedings of the 2000 International Symposium on Mechatronics and Intelligent Mechanical Systems for the 21 Century*, pp. 55–59, held in Changwon, Korea on Oct. 4–7, 2000. In the event of an otherwise irreconcilable conflict, however, the present specification shall control.

We claim:

1. A method for the mass production of substantially identical microstructures, said method comprising the steps of:
   (a) fabricating a first micromold insert having a size and shape that are generally complementary to the size and shape of the desired microstructures;
   (b) fabricating at least one inverse replication of the first micromold insert by depositing a polymeric precursor onto the first micromold insert, and curing the polymeric precursor into a polymeric inverse replication, wherein the accuracy of the polymeric inverse replication is at least about 10 microns;
   (c) coating the inverse replication with an electrically conductive layer;
   (d) electroplating a metallic form complementary to the inverse replication, using the electrically conductive layer as a cathode;
   (e) etching away the electrically conductive layer from the form to produce a second, metallic micromold insert, whose dimensions differ from the dimensions of the first micromold by an amount corresponding to the thickness of the electrically conductive layer,
   (f) repeating steps (c) through (e) a plurality of times to produce a plurality of second micromold inserts; and
   (g) molding a plurality of substantially identical, polymeric microstructures from the second micromold inserts.

2. A method as recited in claim 1, wherein the first micromold insert is fabricated using a LIGA process.

3. A method as recited in claim 1, wherein the inverse replication comprises polydimethylsiloxane.

4. A method as recited in claim 3, wherein the polymeric precursor comprises about a 10:1 ratio of dimethylsiloxane and a curing agent.

5. A method as recited in claim 1, wherein the electrically conducting layer is deposited by electron beam evaporation.

6. A method as recited in claim 1, wherein the electrically conducting layer is deposited by sputtering.

7. A method as recited in claim 1, wherein the electrically conducting layer comprises copper.

8. A method as recited in claim 1, wherein the electrically conducting layer comprises chromium.

9. A method as recited in claim 1, wherein the electrically conducting layer comprises gold.

10. A method as recited in claim 1, wherein the accuracy of the polymeric inverse replication is 100 nanometers.

* * * * *